United States Patent

Keller et al.

[11] Patent Number: 6,028,394
[45] Date of Patent: Feb. 22, 2000

[54] COLD ELECTRON PLASMA REACTIVE ION ETCHING USING A ROTATING ELECTROMAGNETIC FILTER

[75] Inventors: John H. Keller, Newburgh; Dennis K. Coultas, Hopewell Junction, both of N.Y.

[73] Assignee: International Business Machines Corporation, Armonk, N.Y.

[21] Appl. No.: 09/047,095

[22] Filed: Mar. 24, 1998

[51] Int. Cl.[7] .................................................. H05H 1/46
[52] U.S. Cl. .......................... 315/111.41; 315/111.51; 156/345
[58] Field of Search .................... 315/111.41, 111.51, 315/111.71; 118/723 MR, 723 MA, 723 AN, 723 I, 723 IR; 156/345 C, 345 MW, 345 ME, 345 MG; 313/231.31

[56] References Cited

U.S. PATENT DOCUMENTS

| | | | |
|---|---|---|---|
| 4,894,510 | 1/1990 | Nakanishi et al. | 156/345 ME X |
| 5,440,206 | 8/1995 | Kurono et al. | 315/111.41 |
| 5,783,102 | 7/1998 | Keller | 216/68 |

OTHER PUBLICATIONS

U.S. Pat. application 08/841,218 filed Apr. 29, 1997, by John H. Keller for "Reduction of Semiconductor Structure Damage During Reactive Ion Etching."

U.S. Pat. application 08/595,438 filed Feb. 5, 1996, by John H. Keller for "Negative Ion Inductive Source for Etching High Aspect Ratio Structures."

U.S. Pat. application 08/968,194 filed Nov. 12, 1997, by John H. Keller et al. for "Apparatus and Method of Producing a Negative Ion Plasma."

O. Fukumasa et al., "Relationship Between Extraction of H- ions Optimized by Plasma Grid Potential and Plasma Parameters in a Bucket Source " Re. Sci. Instrum. 63 (4), pp. 2696–2701, Apr. 1992.

Y. Nakagawa et al., "New Plasma Source with an UHF (500MHz) Antenna," Thin Solid Films 281–282, pp. 169–171, 1996.

E. M. Middlesworth et al., "Reduction of Charge–Up Damage in Magnetron Rie," ULSI Science and Technology/ 1995, Proceedings vol. 95–5, pp. 236–245, 1995.

G. S. Mathad et al., "Process Dependence of Notching: Simulation of Topography Dependent Charging with Sheath Oscillation Effect," Plasma Processing, Proceedings vol. 96–12, pp.49–60,1996.

Primary Examiner—Justin P. Bettendorf
Attorney, Agent, or Firm—Ratner & Prestia; Jay H. Anderson

[57] ABSTRACT

An apparatus and method for producing a cold electron plasma for etching a work piece. An electromagnetic wave is generated at a first frequency to produce a plasma in a hot plasma region of the etching chamber, the plasma having positive ions, cold electrons, and hot electrons. A plurality of magnetic coils are disposed about the perimeter of the etching chamber for generating a rotating magnetic field with an electron cyclotron resonance at a second frequency. The rotating magnetic field has a magnetic potential such that the rotating magnetic field: (i) allows the positive ions and the cold electrons to diffuse from the plasma through the rotating magnetic field to produce the cold electron plasma in a cold plasma region over the work piece, and (ii) inhibits the hot electrons from the plasma from diffusing through the rotating magnetic field to the cold electron plasma.

19 Claims, 4 Drawing Sheets

6,028,394

1

COLD ELECTRON PLASMA REACTIVE ION ETCHING USING A ROTATING ELECTROMAGNETIC FILTER

RELATED APPLICATION

The present invention is related to U.S. patent application Ser. No. 08/595,438, now U.S. Pat. No. 5,783,102 titled "Negative Ion Inductive Source for Etching High Aspect Ratio Structures," and to U.S. patent application Ser. No. 08/968,194, titled "Apparatus and Method of Producing a Negative Ion Plasma," both issued to John H. Keller; assigned to the assignee of the present application; and incorporated herein by reference.

FIELD OF THE INVENTION

The present invention relates generally to an apparatus and method for producing a cold electron plasma for etching microelectronic devices and, more particularly, using a rotating magnetic field as a filter in producing the cold electron plasma.

BACKGROUND

Reactive Ion Etch (RIE) is used to form shapes on work pieces such as semiconductor wafers. In a typical RIE process, radio frequency (RF) or microwave power is used to excite a gas to form a plasma. The plasma facilitates etching the shapes into the work piece. A typical use of the RIE process is in etching very fine holes, typically minimum dimension sized holes, through a layer, e.g., an insulating layer, to an underlying layer, commonly referred to as "opening contacts" or "opening vias" through the layer. RIE is also used to open minimum width trenches through one or more work piece layers. Typically, these minimum dimension shapes are deeper than at least one of their surface dimensions and, therefore, have a high aspect ratio.

FIG. 1A is a schematic diagram of a conventional diode RIE system 100, such as an MXP chamber of the AME 5X00 series, manufactured by Applied Materials Corp. The RIE system includes an etching chamber 2. A window 4 is formed in one portion of etching chamber 2 for viewing the RIE process from outside etching chamber 2. A slot 6 is formed in another portion of etching chamber 2 through which a work piece such as a semiconductor wafer may be inserted for etching. A pump 8 is connected to etching chamber 2 for creating a vacuum in etching chamber 2. Magnetic coils 10a, 10b, 12a, and 12b are disposed about the perimeter of etching chamber 2. Each magnetic coil is offset by about 90 degrees from the magnetic coils on either side. For example, magnetic coil 10a is offset by about 90 degrees from magnetic coils 12a and 12b, respectively. Magnetic coil 10a faces magnetic coil 10b across etching chamber 2 and, similarly, magnetic coil 12a faces magnetic coil 12b across etching chamber 2.

Magnetic coils 10a, 10b, 12a, and 12b are typically driven by an AC power source (not shown) providing sinusoidal functions. In particular, magnetic coils 10a and 10b are driven by a first sinusoidal function provided by the AC power source, and magnetic coils 12a and 12b are driven by a second sinusoidal function offset by approximately 90 degrees with respect to the first sinusoidal function. As such, at a first phase corresponding to a maximum of the first sinusoidal function, a magnetic field passes between magnetic coils 10a and 10b across etching chamber 2. Similarly, at a second phase corresponding to a maximum of the second sinusoidal function, a magnetic field passes between

2 magnetic coils 12a and 12b. In this way, magnetic coils 10a, 10b, 12a, and 12b produce a magnetic field which rotates over time with respect to etching chamber 2. The magnetic field produced by magnetic coils 10a, 10b, 12a, and 12b typically rotates at a rate of about 0.2 Hertz (Hz).

FIG. 1B illustrates a cross-sectional view of the conventional diode RIE system 100 of FIG. 1A. Gas is injected into etching chamber 2 through shower head 24 and is pumped out of etching chamber 2 by pump 8. A semiconductor wafer 14 has been inserted through slot 6 (shown in FIG. 1A), dropped onto a work piece chuck 16, and clamped to a work piece chuck electrode 18 formed as a portion of work piece chuck 16. Work piece chuck electrode 18 is driven by a power supply 20. Power supply 20 creates a radio frequency (RF) field through work piece chuck electrode 18 which, in turn, produces a plasma 22. Plasma 22 may diffuse slightly along the sides of work piece chuck 18. A rotating electromagnetic field 26 is produced by magnetic coils 10a, 10b, 12a, and 12b, as described with reference to FIG. 1A. Specifically, FIG. 1B illustrates electromagnetic field 26 at a time corresponding to the first phase described above, such that rotating electromagnetic field 26 passes between magnetic coils 10a and 10b across etching chamber 2.

Because electron plasma 22 is generated by AC power source 20 through work piece chuck electrode 18, electron plasma 22 is capacitively driven. As such, the plasma efficiency of conventional diode RIE system 100 decreases as the density of plasma 22 increases. Therefore, for the conventional diode RIE system to operate efficiently, the density of plasma 22 is low. Such an RIE system 100 often results, however, in less-than-desirable etch rates, plasma non-uniformities, and ionic charging.

Effects from ionic charging, known to those skilled in the art as "aspect ratio charging effects," typically occur at the bottom of high aspect ratio structures, especially if some part of the structure is an insulator. These aspect ratio charging effects include oxide damage, device damage, threshold voltage shifts, polysilicon notching, and reduction of ion current at the bottom of trenches and at the bottom of vias that impede or even stop etching (known as RIE lag).

As line widths have decreased and aspect ratios of etch structures have increased, aspect ratio charging effects have become more problematic. These charging effects are due, at least in part, to the fact that, in the conventional RIE system, electrons diffuse out of the plasma due to high thermal energy and densities while positive ions are extracted. Thus, positive ions are accelerated to various locations on the structure and electrons spread and are collected near mask surfaces until a potential develops which equalizes these two particle fluxes. There remains a need, therefore, to eliminate aspect ratio charging effects.

SUMMARY OF THE INVENTION

To meet this and other needs, and in view of its purposes, the present invention provides an apparatus and method for producing a cold electron plasma for etching a work piece. An apparatus according to an exemplary embodiment of the present invention includes a generator for generating an electromagnetic wave at a first frequency to produce a plasma in a hot plasma region of the etching chamber, the plasma having at least positive ions, cold electrons, and hot electrons. A plurality of magnetic coils are disposed about the perimeter of the etching chamber for generating a rotating magnetic field with an electron cyclotron resonance at a second frequency. The rotating magnetic field has a magnetic potential such that the rotating magnetic field: (i)

allows the positive ions and the cold electrons to diffuse from the plasma through the rotating magnetic field to produce the cold electron plasma in a cold plasma region over the work piece, and (ii) inhibits the hot electrons from the plasma from diffusing through the rotating magnetic field to the cold electron plasma.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION

Figure 1A:
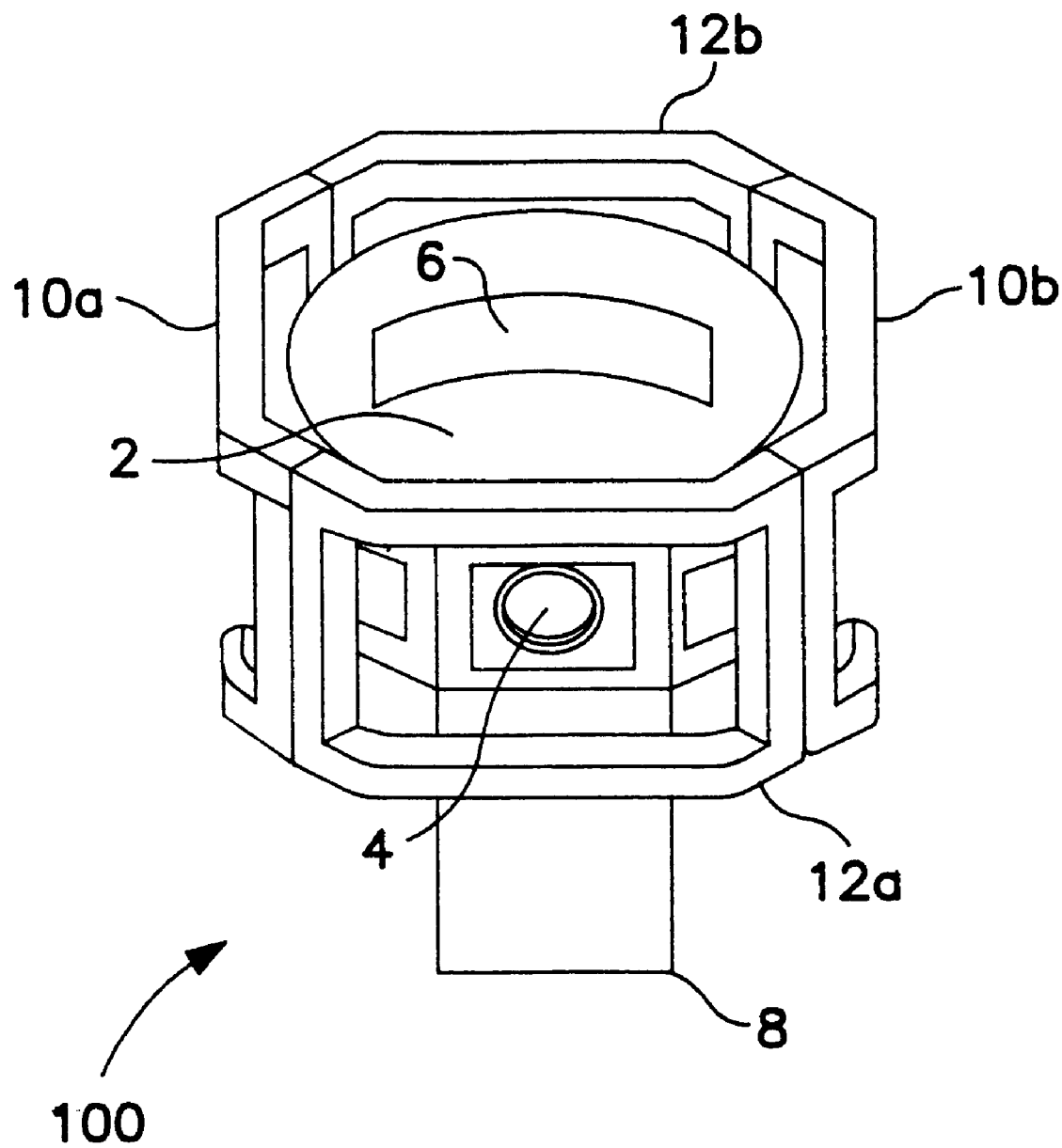
FIG. 1A is a schematic block diagram of a conventional diode RIE system.
Figure 1B:
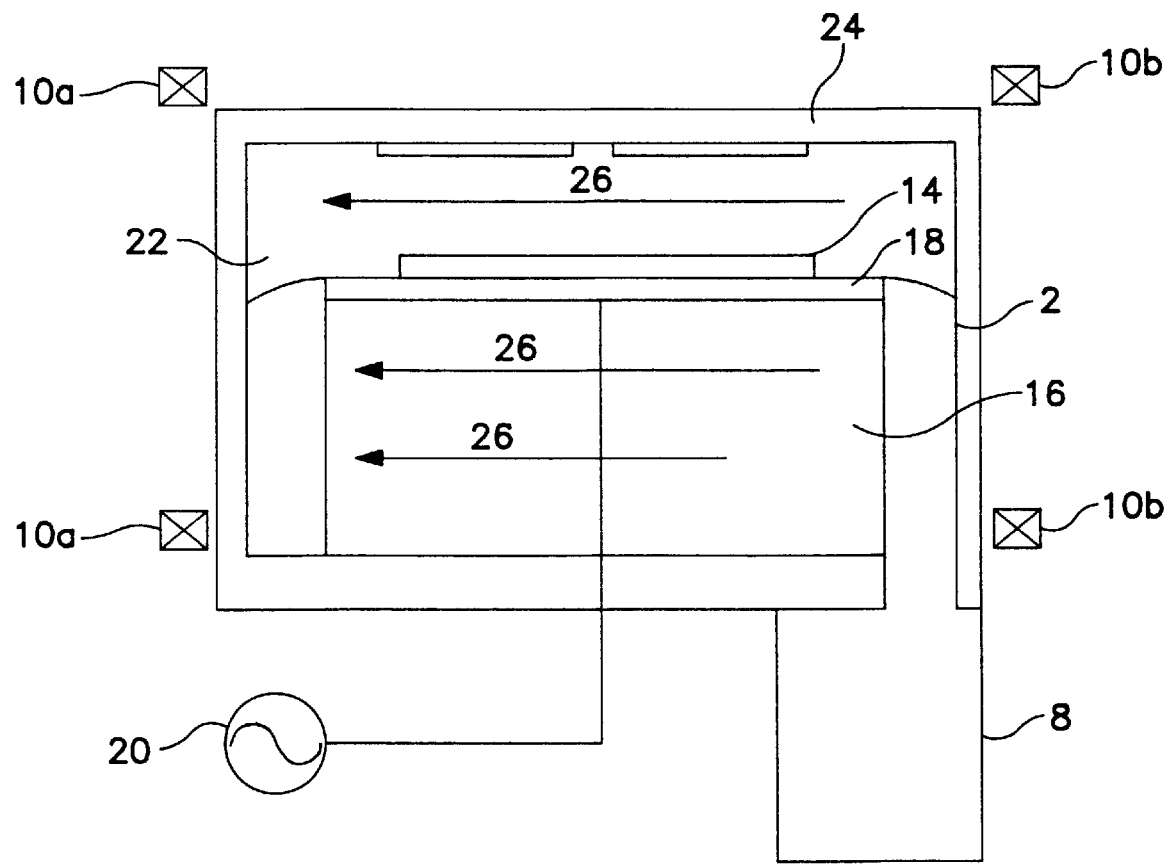
FIG. 1B is a schematic block diagram of a vertical cross section of the conventional diode RIE system shown in FIG. 1A.
Figure 2:
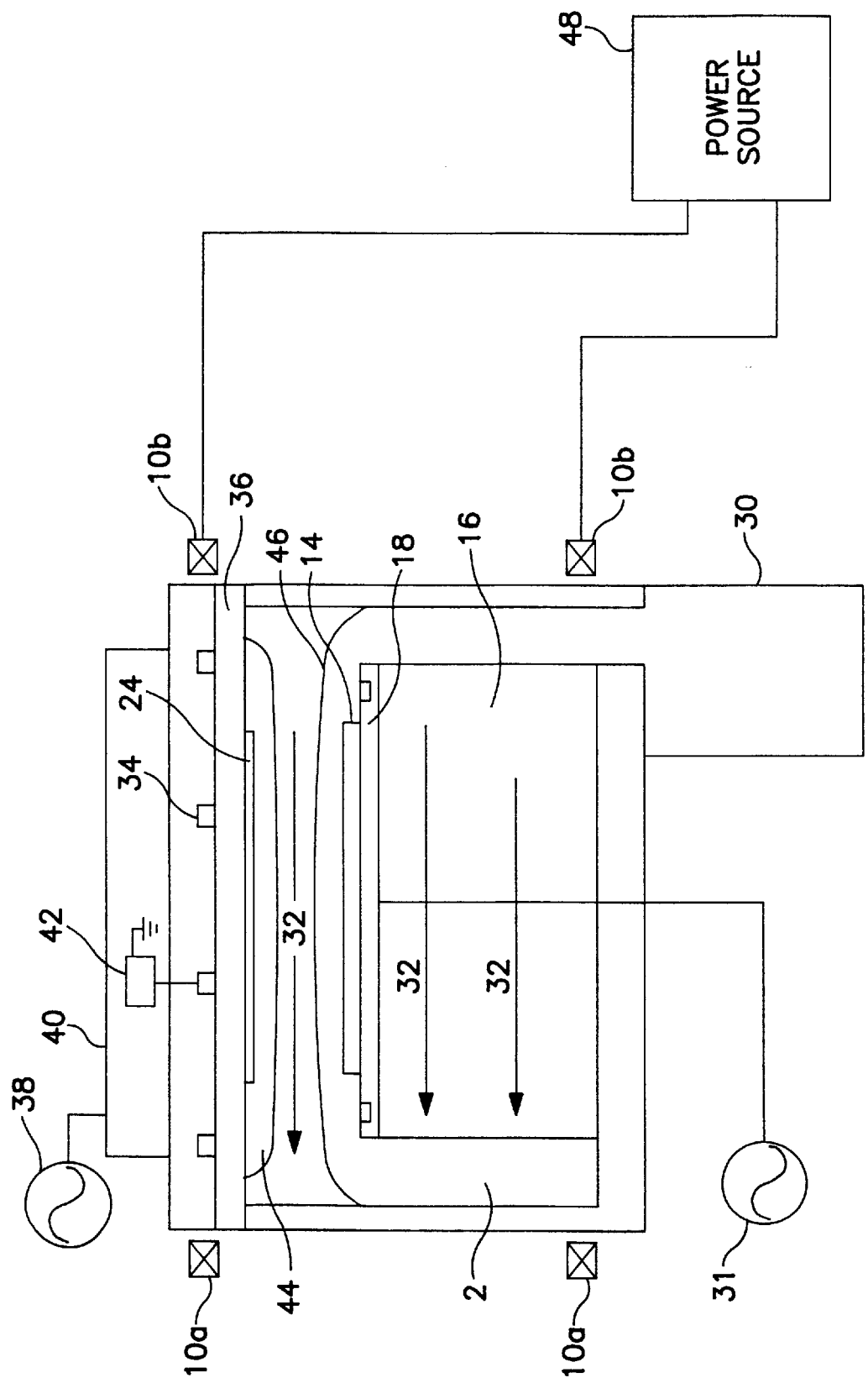
FIG. 2 is a schematic block diagram of a vertical cross section of an apparatus for producing a cold electron plasma according to a first embodiment of the present invention.

Referring now to the drawing, wherein like reference numerals refer to like elements throughout, FIG. 2 illustrates a vertical cross section of an apparatus for producing a cold electron plasma 46 for etching a work piece, such as semiconductor wafer 14, according to a first embodiment of the present invention. Similar to FIGS. 1A and 1B, the apparatus illustrated in FIG. 2 includes an etching chamber 2. As described with reference to FIG. 1A, a window (not shown) and a slot (not shown) may be formed in respective portions of etching chamber 2. A pump 30 is connected to etching chamber 2 for creating a vacuum in etching chamber 2. Pump 30, typically a turbo-pump, desirably operates at about 20 Millitorr (mTorr). Gas is injected into etching chamber 2 through a shower head 24 and is pumped out of etching chamber 2 by pump 30.

A work piece such as semiconductor wafer 14 has been inserted through the slot, dropped onto a work piece chuck 16, and clamped to a work piece chuck electrode 18 formed as a portion of work piece chuck 16. Semiconductor wafer 14 can be electrostatically or mechanically clamped to work piece chuck electrode 18. Work piece chuck electrode 18 is driven by a matching network (not shown) and RF source 31 for applying an RF bias to semiconductor wafer 14.

As illustrated in FIG. 2, the apparatus for producing a cold electron plasma according to the first embodiment of the present invention further includes magnetic coils 10a, 10b, 12a (not shown), and 12b (not shown), similar in design to those of FIGS. 1A and 1B. Magnetic coils 10a, 10b, 12a, and 12b cooperate to produce a rotating magnetic field 32, similar to magnetic field 26 as described with reference to FIG. 1B. As with the system shown in FIG. 1B, FIG. 2 illustrates electromagnetic field 32 at a time corresponding to the first phase described above, such that rotating electromagnetic field 32 passes between magnetic coils 10a and 10b across etching chamber 2. Magnetic coils 10a, 10b, 12a, and 12b are positioned such that rotating magnetic field 32 is oriented substantially parallel to the surface of the work piece being etched, for example, semiconductor wafer 14.

As illustrated in FIG. 2, an inductive coil 34 is separated from etching chamber 2 by a dielectric window 36. Inductive coil 34 is driven by a generator 38 and matching network 40 and is grounded through impedance 42. According to this first embodiment, generator 38, matching network 40, and inductive coil 34 combine to provide an inductive plasma source, although this source may be any other type of plasma source such as helicon, electron cyclotron resonance (ECR), ultra-high frequency (UHF), or magnetron. The frequency of generator 38 may range from as low as 40 megahertz (MHz) up to ECR frequencies on the order of 2.45 Gigahertz (GHz).

Generator 38, matching network 40, and inductive coil 34 cooperate to generate an electromagnetic wave to produce an inductively driven, high-density, substantially uniform, plasma 44 in a hot plasma region of etching chamber 2. Plasma 44 has positive ions, cold electrons, and hot electrons. A power source 48 generates rotating magnetic field 32 through magnetic coils 10a, 10b, 12a, and 12b, disposed about the perimeter of etching chamber 2, causing rotating magnetic field 32 to have a magnetic potential between plasma 44 and semiconductor wafer 18 such that rotating magnetic field 32: (i) allows the positive ions and the cold electrons to diffuse from plasma 44 through rotating magnetic field 32 to produce a cold electron plasma 46 in a cold plasma region over the work piece, and (ii) inhibits the hot electrons from plasma 44 from diffusing through rotating magnetic field 32 to cold electron plasma 46. To this end, power source 48 causes the magnetic potential of rotating magnetic field 32 to be such that the integral of the field down to the work piece is on the order of or above about 200 Gauss-cm.

By allowing positive ions and cold electrons to diffuse from plasma 44 to cold electron plasma 46 while preventing hot electrons from so diffusing, rotating magnetic field 32 functions as a filter between plasma 44 and cold electron plasma 46. This filtering is desirable because it allows cold electron plasma 46 to have a low electron temperature, thus eliminating or greatly reducing aspect ratio charging effects. The diffusion of hot electrons through rotating magnetic field 32 would cause the electron temperature of cold electron plasma 46 to increase, making aspect ratio charging effects more likely to occur.

According to another exemplary embodiment of the present invention, the strength of power source 48 may be adjusted to control the magnetic potential of rotating magnetic field 32 to, in turn, control the respective diffusion rates of hot electrons and negative ions through rotating magnetic field 32 to cold electron plasma 46. As such, rotating magnetic field 32 essentially functions as an adjustable filter in controlling the electron temperature of cold electron plasma 46.

Generator 38, matching network 40, and inductive coil 34 cooperate to generate an electromagnetic wave in plasma 44 at a first frequency. Power source 48 drives magnetic coils 10a, 10b, 12a, and 12b to produce rotating magnetic field 32 having an electron cyclotron resonance at a second frequency. Power source 48 and the magnetic coils cooperate to cause the second frequency of the electron cyclotron resonance of rotating magnetic field 32 to be less than the first frequency of the electromagnetic wave to prevent the electromagnetic wave from propagating and penetrating rotating magnetic field 32 and heating cold electron plasma 46. In particular, causing the second frequency of the electron cyclotron resonance of rotating magnetic field 32 to be less than the first frequency of the electromagnetic wave causes the magnitude of the electromagnetic wave to decrease, typically exponentially, as the electromagnetic wave begins to pass into plasma 44 and rotating magnetic field 32. The first frequency, the second frequency, and the width of rotating magnetic field 32 are desirably such that the width of rotating magnetic field 32 from plasma 44 to wafer 14 is larger than about two skin depths of the electromagnetic wave in rotating magnetic field 32.

Although the first embodiment of the present invention has been described only in terms of setting the second frequency of the electron cyclotron resonance of rotating magnetic field 32 with respect to the frequency of the electromagnetic wave, the same relationship may be established according to other embodiments of the present invention. According to one exemplary embodiment, generator 38 causes the first frequency of the electromagnetic wave to be greater than the second frequency of the electron cyclotron resonance of rotating magnetic field 32 to prevent the electromagnetic wave from penetrating rotating magnetic field 32.

In one example, power source 48 produces a rotating magnetic field 32 having a magnitude of about 25 Gauss and a corresponding electron cyclotron resonance of about 68 Mhz. Accordingly, the generator 38 desirably produces the electromagnetic wave at a frequency above about 68 MHz so that rotating magnetic field 32 does not cause propagation of the electromagnetic wave penetrating rotating magnetic field 32 and heating cold electron plasma 46. Due to industry constraints, a plasma source having a radio frequency of about 80 MHz would typically be used, although plasma sources operating at other frequencies above about 68 MHz may also be used, as will be appreciated by those skilled in the art.

Work piece chuck 16 is situated in the cold plasma region and serves to hold the work piece (such as semiconductor wafer 14, for example) being etched by the cold electron plasma 46 in the cold plasma region. RF source 31 is connected to work piece chuck 16 for applying a radio frequency (RF) bias to the work piece to accelerate the positive ions or the cold electrons from cold electron plasma 46 toward the work piece. The frequency of the RF source 31 is desirably controlled to substantially prevent the RF bias power from heating the cold electrons in cold electron plasma 46. In particular, the frequency of RF source 31 is desirably low enough such that the RF bias applied to work piece chuck electrode 18 does not significantly heat the cold electrons in cold electron plasma 46.

Typically, the frequency of the RF source 31 is on the order of about 1 MHz or less to prevent cold electron plasma 46 from being heated. According to one embodiment of the present invention, such frequency may be altered as desired to minimize the heating o f electrons in cold electron plasma 46. Moreover, the RF waveform produced by the RF bias supply may be shaped as desired so that the positive part of the RF waveform is narrower and larger than the negative part of the RF waveform.

Figure 3:
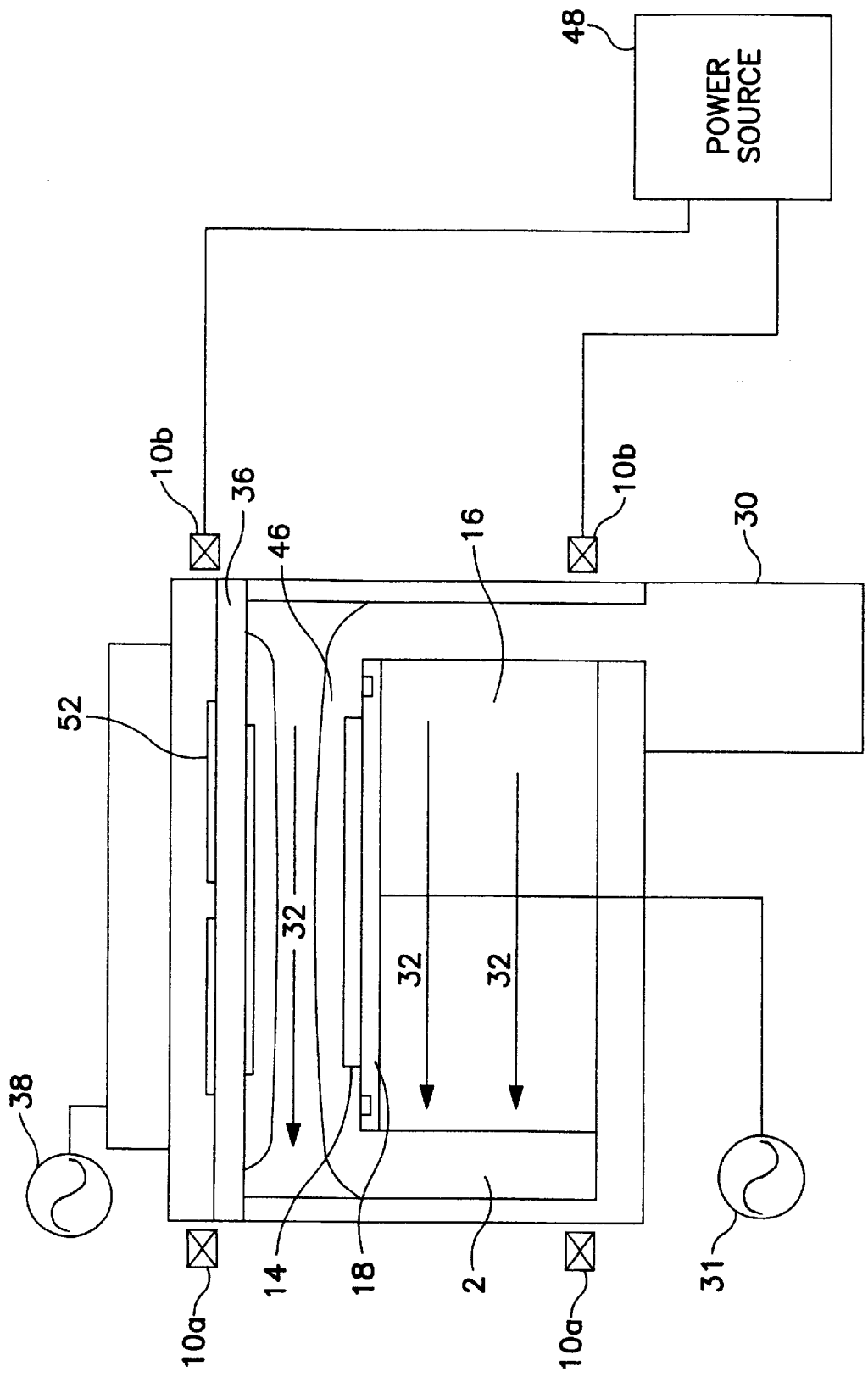
FIG. 3 is a schematic block diagram of a vertical cross section of an apparatus for producing a cold electron plasma according to a second embodiment of the present invention.

FIG. 3 illustrates an apparatus for producing a cold electron plasma according to a second embodiment of the present invention. The apparatus illustrated in FIG. 3 is similar to the apparatus of FIG. 2 in most respects. The apparatus in FIG. 3 uses an antenna 52, however, rather than inductive coil 34 for generating the electromagnetic wave in plasma 44. According to this second embodiment, generator 38 desirably produces an ultra-high frequency (UHF) electromagnetic wave.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method of producing a cold electron plasma for etching a work piece comprising the steps of:
    (a) generating an electromagnetic wave at a first frequency to produce a plasma in a hot plasma region, the plasma having positive ions, cold electrons, and hot electrons;
    (b) generating a rotating magnetic field with an electron cyclotron resonance at a second frequency, the rotating magnetic field having a magnetic potential such that the rotating magnetic field:
        i) allows the positive ions and the cold electrons to diffuse from the plasma through the rotating magnetic field to produce the cold electron plasma in a cold plasma region, and
        ii) inhibits the hot electrons from the plasma from diffusing through the rotating magnetic field to the cold electron plasma.

2. The method according to claim 1, wherein the second frequency is less than the first frequency to prevent the electromagnetic wave from:
    (i) penetrating the rotating magnetic field, and
    (ii) heating the cold electron plasma.

3. The method according to claim 2, wherein the first frequency, the second frequency, and the width of the rotating magnetic field are such that the width of the rotating magnetic field is larger than about two skin depths of the electromagnetic wave in the rotating magnetic field.

4. The method according to claim 1 wherein the magnetic potential of the rotating magnetic field generated in step (b) is such that the integral of the field down to the work piece is on the order of about 200 Gauss-cm.

5. The method according to claim 1 wherein the magnetic potential of the rotating magnetic field generated in step (b) is such that the integral of the field down to the work piece is above about 200 Gauss-cm.

6. The method according to claim 1 further comprising the step of:
    (c) controlling the magnetic potential of the rotating magnetic field to control the respective diffusion rates of the positive ions, the cold electrons, and the hot electrons through the rotating magnetic field.

7. The method according to claim 1 further comprising the step of:
    (c) applying a radio frequency (RF) bias to the work piece to accelerate ones of the positive ions and the cold electrons from the cold electron plasma toward the work piece.

8. The method according to claim 7 further comprising the step of:
    (d) controlling the frequency of the RF bias to substantially prevent the RF bias from heating the cold electrons in the cold electron plasma.

9. The method according to claim 7, the RF bias having a positive part and a negative part, further comprising the step of:
    (e) shaping the RF bias so that the positive part is narrower and larger than the negative part.

10. An apparatus for producing a cold electron plasma for etching a work piece in an etching chamber comprising:
    means for generating an electromagnetic wave at a first frequency to produce a plasma in a hot plasma region of the etching chamber, the plasma having positive ions, cold electrons, and hot electrons; and a plurality of magnetic coils disposed about the perimeter of the etching chamber for generating a rotating magnetic field with an electron cyclotron resonance at a second frequency, the rotating magnetic field having a magnetic potential such that the rotating magnetic field:
   (i) allows the positive ions and the cold electrons to diffuse from the plasma through the rotating magnetic field to produce the cold electron plasma in a cold plasma region over the work piece, and
   (ii) inhibits the hot electrons from the plasma from diffusing through the rotating magnetic field to the cold electron plasma.

11. The apparatus according to claim 10, wherein the generating means generates the electromagnetic wave through an inductive coil.

12. The apparatus according to claim 10, wherein the generating means generates the electromagnetic wave through an antenna.

13. The apparatus according to claim 10 further comprising a power source for driving the plurality of magnetic coils to produce the rotating magnetic field with the electron cyclotron resonance at the second frequency, wherein the power source and the magnetic coils cooperate to cause the second frequency of the electron cyclotron resonance of the rotating magnetic field to be less than the first frequency to prevent the electromagnetic wave from:
   (i) penetrating the rotating magnetic field, and
   (ii) heating the cold electron plasma.

14. The apparatus according to claim 13, wherein the first frequency, the second frequency, and the width of the rotating magnetic field are such that the width of the rotating magnetic field is larger than about two skin depths of the electromagnetic wave in the rotating magnetic field.

15. The apparatus according to claim 13, wherein the power source causes the magnetic potential of the rotating magnetic field to be such that the integral of the field down to the work piece is on the order of about 200 Gauss-cm.

16. The apparatus according to claim 13 wherein the strength of the power source is adjustable to control the magnetic potential of the rotating magnetic field to, in turn, control the respective diffusion rates of the positive ions, the cold electrons, and the hot electrons through the rotating magnetic field.

17. The apparatus according to claim 10 further comprising:

a work piece chuck in said cold plasma region, said work piece chuck serving to hold the work piece being etched by the cold electron plasma in the cold plasma region; and an RF source connected to the work piece chuck for applying a radio frequency (RF) bias to the work piece to accelerate ones of the positive ions and the cold electrons from the cold electron plasma toward the work piece.

18. The apparatus according to claim 17 wherein the frequency of the RF source is controlled to substantially prevent the RF bias power from heating the cold electrons in the cold electron plasma.

19. The apparatus according to claim 10 wherein the plurality of magnetic coils are positioned such that the generated rotating magnetic field is oriented substantially parallel to the surface of the work piece.

* * * * *